(12) United States Patent
Wang et al.

(10) Patent No.: US 12,032,096 B2
(45) Date of Patent: Jul. 9, 2024

(54) ADJUSTABLE IRIS FOR LIDAR SYSTEM USING MEMS ROTARY BLADES

(71) Applicant: BEIJING VOYAGER TECHNOLOGY CO., LTD., Beijing (CN)

(72) Inventors: Youmin Wang, Berkeley, CA (US); Yue Lu, Mountain View, CA (US)

(73) Assignee: BEIJING VOYAGER TECHNOLOGY CO., LTD., Beijing (CN)

( * ) Notice: Subject to any disclaimer, the term of this patent is extended or adjusted under 35 U.S.C. 154(b) by 866 days.

(21) Appl. No.: 17/133,557

(22) Filed: Dec. 23, 2020

(65) Prior Publication Data

US 2022/0196805 A1  Jun. 23, 2022

(51) Int. Cl.
| | |
|---|---|
| *G01S 7/48* | (2006.01) |
| *G01S 7/481* | (2006.01) |
| *G01S 17/89* | (2020.01) |
| *G01S 17/931* | (2020.01) |

(52) U.S. Cl.
CPC .......... *G01S 7/4816* (2013.01); *G01S 7/4817* (2013.01); *G01S 17/89* (2013.01); *G01S 17/931* (2020.01)

(58) Field of Classification Search
None
See application file for complete search history.

(56) References Cited

U.S. PATENT DOCUMENTS

| | | | |
|---|---|---|---|
| 2013/0038736 A1* | 2/2013 | Yamamura | F21S 41/155 348/148 |
| 2021/0231285 A1* | 7/2021 | Kanamori | B60Q 1/08 |

* cited by examiner

*Primary Examiner* — Hovhannes Baghdasaryan
(74) *Attorney, Agent, or Firm* — BAYES PLLC

(57) ABSTRACT

Embodiments of the disclosure provide an optical sensing system, a method for adjusting a receiving aperture in the optical sensing system, and an adjustable iris in the optical sensing system. The exemplary optical sensing system includes a transmitter configured to emit light beams to an environment. The optical sensing system further includes a receiver configured to receive the light beams returning from the environment. The receiver includes an adjustable iris including a plurality of rotary blades each driven by a MEMS actuator. The plurality of rotary blades collectively form an adjustable receiving aperture for the returned light beams to pass through. The plurality of rotary blades are configured to rotate in order to vary the adjustable receiving aperture during operation of the optical sensing system. The optical sensing system also includes a detector configured to detect the light beams that pass through the adjustable iris.

20 Claims, 8 Drawing Sheets

ADJUSTABLE IRIS FOR LIDAR SYSTEM USING MEMS ROTARY BLADES

TECHNICAL FIELD

The present disclosure relates to an adjustable iris for a light detection and ranging (LiDAR) system, and more particularly to, an adjustable iris for adjusting a receiving aperture of a LiDAR receiver implemented using MEMS rotary blades.

BACKGROUND

Optical sensing systems such as LiDAR systems have been widely used in advanced navigation technologies, such as to aid autonomous driving or to generate high-definition maps. For example, a typical LiDAR system measures the distance to a target by illuminating the target with pulsed laser light beams and measuring the reflected pulses with a sensor such as a detector or a detector array. Differences in laser light return times, wavelengths, and/or phases can then be used to construct digital three-dimensional (3D) representations of the target. Because using a narrow laser beam as the incident light can map physical features with very high resolution, a LiDAR system is particularly suitable for applications such as sensing in autonomous driving and high-definition map surveys.

The pulsed laser light beams emitted by a LiDAR system are typically directed to multiple directions to cover a field of view (FOV). For example, the vertical detection angle (known as the look-down angle when the scanning laser beam points downward) of the LiDAR system varies to scan objects in a vertical space. The required detection distance varies with the vertical detection angle. For instance, when the look-down angle is small, i.e., LiDAR emits scanning laser beam nearly horizontally, the distance toward an object is longer. On the other hand, with an increasing looking-down angle, the distance toward the ground is shorter.

Conventional LiDAR receivers use the same receiving aperture to receive the laser beams reflected from different detection distances. However, laser beams reflected by objects at shorter distance (e.g., near the ground) may carry higher power (e.g., higher intensity). As a result, the laser beams reflected from shorter distances may result in saturation on the receiver. Receiver saturation can impair the accuracy of its measurement of the distance and cause other problems such as overheating and instability of the receiver.

Embodiments of the disclosure improve the performance of optical sensing systems such as LiDAR systems by implementing an adjustable iris for adjusting a receiving aperture in a LiDAR receiver using MEMS rotary blades.

SUMMARY

Embodiments of the disclosure provide an optical sensing system. The exemplary optical sensing system includes a transmitter configured to emit light beams to an environment. The optical sensing system further includes a receiver configured to receive the light beams returning from the environment. The receiver includes an adjustable iris including a plurality of rotary blades each driven by a MEMS actuator. The plurality of rotary blades collectively form an adjustable receiving aperture for the returned light beams to pass through. The plurality of rotary blades are configured to rotate in order to vary the adjustable receiving aperture during operation of the optical sensing system. The optical sensing system also includes a detector configured to detect the light beams that pass through the adjustable iris.

Embodiments of the disclosure also provide a method for sensing using an optical sensing system. The exemplary method includes emitting, by a transmitter, light beams to an environment. The method further includes receiving, by an adjustable iris, the light beams returning from the environment. The adjustable iris includes a plurality of rotary blades each driven by a MEMS actuator. The plurality of rotary blades collectively form an adjustable receiving aperture for the returned light beams to pass through. The method of receiving the light beams further include controlling the plurality of rotary blades to rotate in order to vary the adjustable receiving aperture during operation of the optical sensing system. The method also includes detecting, by a detector, the light beams that pass through the adjustable iris.

Embodiments of the disclosure further provide an adjustable iris. The exemplary adjustable iris includes a plurality of rotary blades collectively forming an adjustable receiving aperture for the returned light beams to pass through. The plurality of rotary blades are arranged circularly around a center of the adjustable iris. The adjustable iris further includes a plurality of MEMS actuators each driving a rotary blade. The MEMS actuators are configured to rotate the respective rotary blades towards the center of the adjustable iris to reduce the adjustable receiving aperture and rotate away from the center to enlarge the adjustable receiving aperture.

It is to be understood that both the foregoing general description and the following detailed description are exemplary and explanatory only and are not restrictive of the invention, as claimed.

DETAILED DESCRIPTION

Reference will now be made in detail to the exemplary embodiments, examples of which are illustrated in the accompanying drawings. Wherever possible, the same reference numbers will be used throughout the drawings to refer to the same or like parts.

Embodiments of the present disclosure provide systems and methods for controlling an adjustable iris to adjust an adjustable receiving aperture in an optical sensing system (e.g., a LiDAR system). For example, the optical sensing system may include a transmitter configured to emit light beams (e.g., laser beams) at a plurality of vertical detection angles to scan an object. At smaller vertical detection angles, the detection distance is longer while at larger vertical detection angles, the detection distance shortens. The emitted light beams are reflected and returned from the object being scanned, and received by a receiver of the optical sensing system. In some embodiments of the present disclosure, the receiver may have an adjustable receiving aperture realized by using an adjustable iris. The adjustable iris adjusts the amount of returned light that can pass through to a detector of the receiver. In some embodiments, the adjustable iris includes a plurality of rotary blades each driven by a micro-electromechanical system (MEMS) actuator.

In some embodiments, the optical sensing system includes a controller configured to generate command signal for controlling the MEMS actuators to rotate the rotary blades of the adjustable iris for adjusting the receiving aperture size. For example, the adjustable receiving aperture may be adjusted according to the detection distances at the various vertical detection angles, as light beams returned from shorter detection distances carry higher laser power and thus warrant reducing the size of the adjustable receiving aperture. As another example, the controller may determine a threshold angle based on an elevation of the optical sensing system positioned above a ground and a threshold detection distance of the optical sensing system. The controller then reduces the size of the adjustable receiving aperture when the vertical detection angle surpasses the threshold angle.

By dynamically varying the adjustable receiving aperture, embodiments of the present disclosure therefore improve the performance of an optical sensing system. For example, by avoiding saturation on the receiver end, the detection accuracy of the optical sensing system can be improved. On the other hand, reducing the received light power in the receiver also benefits thermal efficiency of the system. The improved optical sensing system can be used in many applications. For example, the improved optical sensing system can be used in advanced navigation technologies, such as to aid autonomous driving or to generate high-definition maps, in which the optical sensing system can be equipped on a vehicle.

Figure 1:
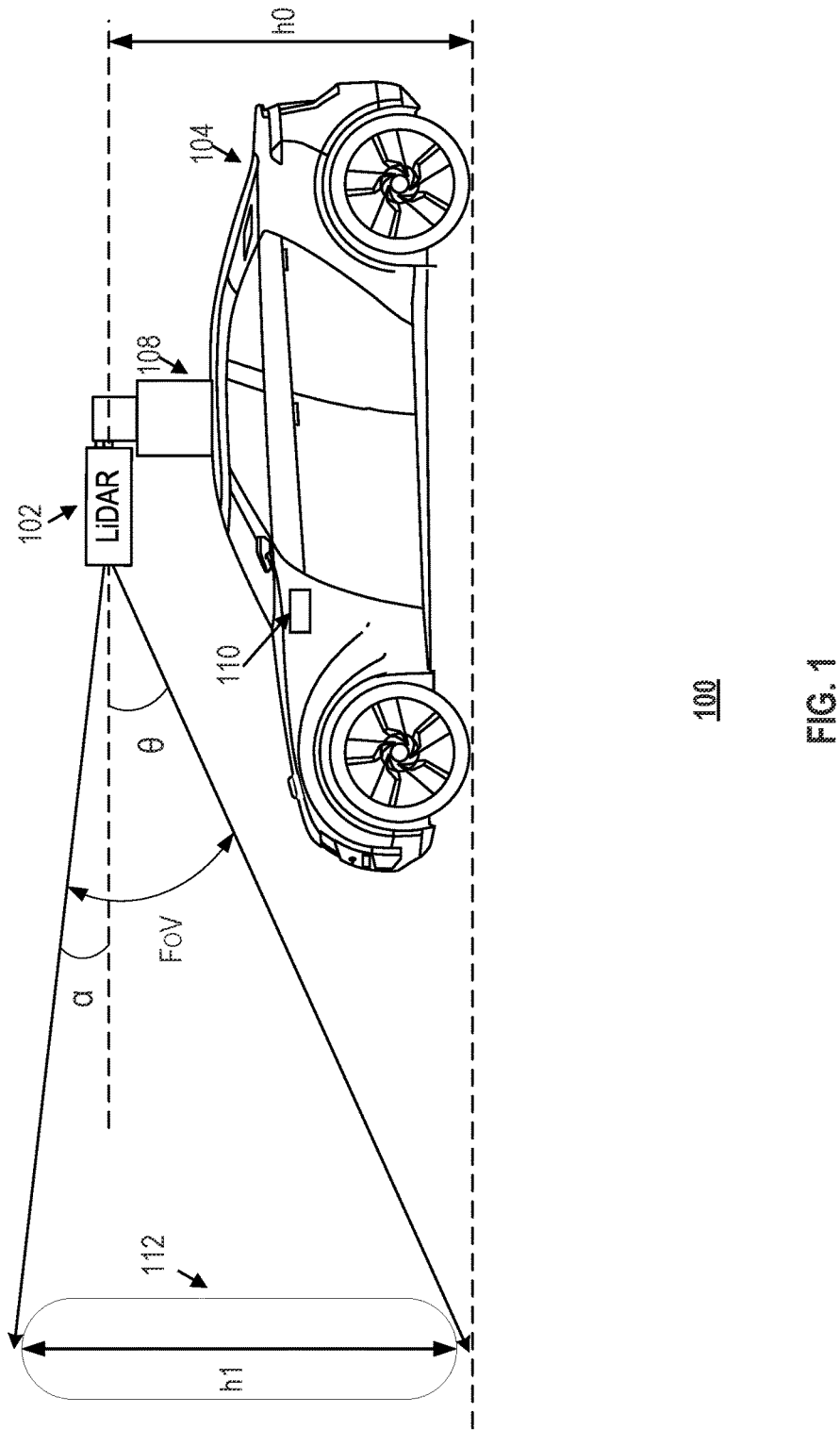
FIG. 1 illustrates a schematic diagram of an exemplary vehicle equipped with a LiDAR system, according to embodiments of the disclosure.

For example, FIG. 1 illustrates a schematic diagram of an exemplary vehicle 100 equipped with an optical sensing system (e.g., a LiDAR system) 102 (hereinafter also referred to as LiDAR system 102), according to embodiments of the disclosure. Consistent with some embodiments, vehicle 100 may be a survey vehicle configured for acquiring data for constructing a high-definition map or 3-D buildings and city modeling. Vehicle 100 may also be an autonomous driving vehicle.

As illustrated in FIG. 1, vehicle 100 may be equipped with LiDAR system 102 mounted to a body 104 via a mounting structure 108. Mounting structure 108 may be an electro-mechanical device installed or otherwise attached to body 104 of vehicle 100. In some embodiments of the present disclosure, mounting structure 108 may use screws, adhesives, or another mounting mechanism. Vehicle 100 may be additionally equipped with a sensor 110 inside or outside body 104 using any suitable mounting mechanisms. Sensor 110 may include sensors used in a navigation unit, such as a Global Positioning System (GPS) receiver and one or more Inertial Measurement Unit (IMU) sensors. It is contemplated that the manners in which LiDAR system 102 or sensor 110 can be equipped on vehicle 100 are not limited by the example shown in FIG. 1 and may be modified depending on the types of LiDAR system 102 and sensor 110 and/or vehicle 100 to achieve desirable 3D sensing performance.

Consistent with some embodiments, LiDAR system 102 and sensor 110 may be configured to capture data as vehicle 100 moves along a trajectory. For example, a transmitter of LiDAR system 102 may be configured to scan the surrounding environment. LiDAR system 102 measures distance to a target by illuminating the target with a pulsed laser beam and measuring the reflected/scattered pulses with a receiver. The laser beam used for LiDAR system 102 may be ultraviolet, visible, or near infrared. In some embodiments of the present disclosure, LiDAR system 102 may capture point clouds including depth information of the objects in the surrounding environment. As vehicle 100 moves along the trajectory, LiDAR system 102 may continuously capture data. Each set of scene data captured at a certain time range is known as a data frame.

In some embodiments, LiDAR system 102 may be mounted at a certain elevation (e.g., $h_0$ as shown in FIG. 1) above the ground such that it can scan objects at a range of heights using laser beams emitted at different vertical detection angles. For example, FIG. 1 shows a field of view (FOV) consisting of a range of vertical detection angles to cover an object 112 up to $h_1$ in height above the ground. A vertical detection angle of a laser beam pointing upward relative to the horizontal direction (e.g., angle $\alpha$ as shown in FIG. 1) may be referred to as a look-up angle, and a vertical detection angle of a laser beam pointing downward relative to the horizontal direction (e.g., angle $\theta$ as shown in FIG. 1) may be referred to as a look-down angle.

In some embodiments, the vertical detection angle of LiDAR system 102 may be adjusted by mounting structure 108 and/or the scanner within LiDAR system 102. In some embodiments, the vertical detection angle may also be impacted by the pose of vehicle 100, e.g., whether vehicle 100 is traveling uphill or downhill. When the look-down angle $\theta$ is larger than a certain value, the laser beam emitted by LiDAR system 102 may impinge on the ground and the corresponding detection distance may be smaller than the maximum detection distance. In such cases, because the laser beam travels for a shorter distance, it is less attenuated and the remaining power in the returned laser beam is higher. Consistent with the present disclosure, LiDAR system 102 is configured to dynamically adjust the receiving aperture to receive less light in the returned laser beams during a scan, in a way to compensate for the shorter detection distances at larger vertical detection angles $\theta$.

It will be understood by a person of ordinary skill in the art that the vertical detection angle may be just one factor that affects the power of the returned laser beams. In certain scenario, the power may also be affected by the actual location of objects in the field. If an object is in a near field of LiDAR system 102, the returned laser beam at a small vertical detection angle may nevertheless have high power. Accordingly, consistent with the present disclosure, the adjustable iris may be controlled to adjust the receiving aperture based on the actual distance of the object being detected. For example, LiDAR system 102 may be configured to dynamically adjust the receiving aperture based on the object detected in real-time.

Figure 2:
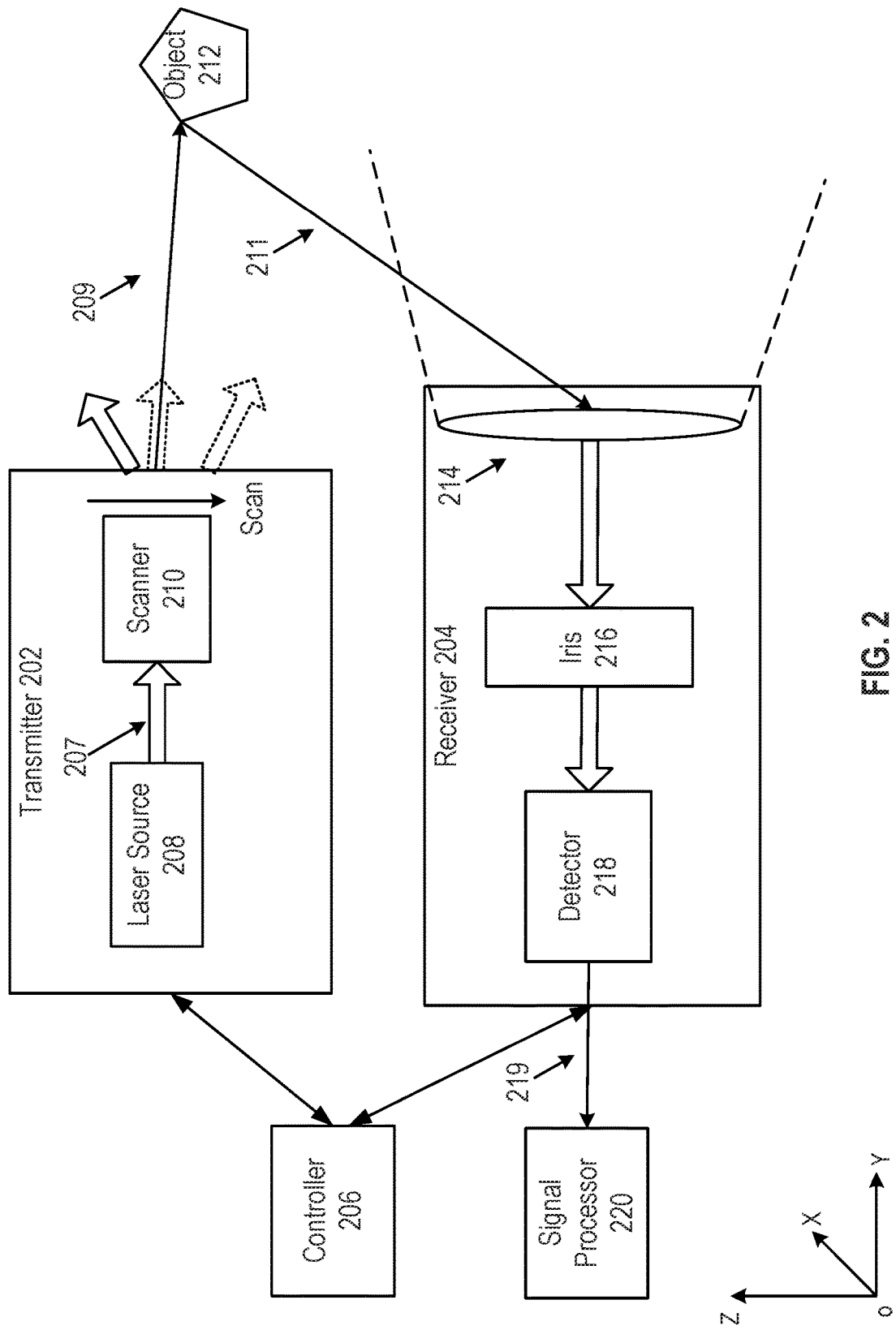
FIG. 2 illustrates a block diagram of an exemplary LiDAR system, according to embodiments of the disclosure.

FIG. 2 illustrates a block diagram of an exemplary LiDAR system 102, according to embodiments of the disclosure. LiDAR system 102 may include a transmitter 202, a receiver 204, a controller 206, and a signal processor 220. Transmitter 202 may emit optical beams (e.g., laser beams) along multiple directions. Transmitter 202 may include one or more laser sources 208 and a scanner 210. Transmitter 202 can sequentially emit a stream of pulsed laser beams in different directions within a scan FOV (e.g., a range in angular degrees), as illustrated in FIG. 2.

Laser source 208 may be configured to provide a laser beam 207 (also referred to as "native laser beam") to scanner 210. In some embodiments of the present disclosure, laser source 208 may generate a pulsed laser beam in the ultraviolet, visible, or near infrared wavelength range. In some embodiments of the present disclosure, laser source 208 may include a pulsed laser diode (PLD), a vertical-cavity surface-emitting laser (VCSEL), a fiber laser, etc. For example, a PLD may be a semiconductor device similar to a light-emitting diode (LED) in which the laser beam is created at the diode's junction. In some embodiments of the present disclosure, a PLD includes a PIN diode in which the active region is in the intrinsic (I) region, and the carriers (electrons and holes) are pumped into the active region from the N and P regions, respectively. Depending on the semiconductor materials, the wavelength of incident laser beam 207 provided by a PLD may be larger than 700 nm, such as 760 nm, 785 nm, 808 nm, 848 nm, 905 nm, 940 nm, 980 nm, 1064 nm, 1083 nm, 1310 nm, 1480 nm, 1512 nm, 1625 nm, 1654 nm, 1877 nm, 1940 nm, 2000 nm, etc. It is understood that any suitable laser source may be used as laser source 208 for emitting laser beam 207.

Scanner 210 may be configured to emit a laser beam 209 to an object 212 in a range of vertical detection angles (collectively forming the FOV of transmitter 202 such as shown in FIG. 1). The vertical detection angles can be look-up angles (pointing upward from the horizontal direction) or look-down angles (pointing downward from the horizontal direction). In some embodiments, scanner 210 may also include optical components (e.g., lenses, mirrors) that can collimate pulsed laser light into a narrow laser beam to increase the scan resolution and the range to scan object 212.

In some embodiments, object 212 may be made of a wide range of materials including, for example, non-metallic objects, rocks, rain, chemical compounds, aerosols, clouds and even single molecules. In some embodiments, at each time point during the scan, scanner 210 may emit laser beam 209 to object 212 in a direction within a range of scanning angles by rotating a deflector, such as a micromachined mirror assembly. Upon contact, laser beam 209 can be reflected/scattered by object 212 via backscattering (e.g., Rayleigh scattering, Mie scattering, Raman scattering, and fluorescence) to form a returned laser beam 211.

In some embodiments, receiver 204 may be configured to detect returned laser beam 211 and convert it to electrical signals (e.g., electrical signals 219) reflecting the intensity of returned laser beam 211. In some embodiments, returned laser beam 211 may be in a different direction from laser beam 209. As illustrated in FIG. 2, receiver 204 may include a lens 214, an iris 216, and a detector 218. At each time point during the scan, returned light beams may be collected by lens 214. For example, lens 214 may be configured to collect laser beam 211 from a respective direction in the receiver field of view (FOV) and converge the collected light beams to focus on iris 216. Depending on the adjusted receiving aperture, a portion of the converged light beams may pass through iris 216 and be detected by detector 218.

Figure 3:
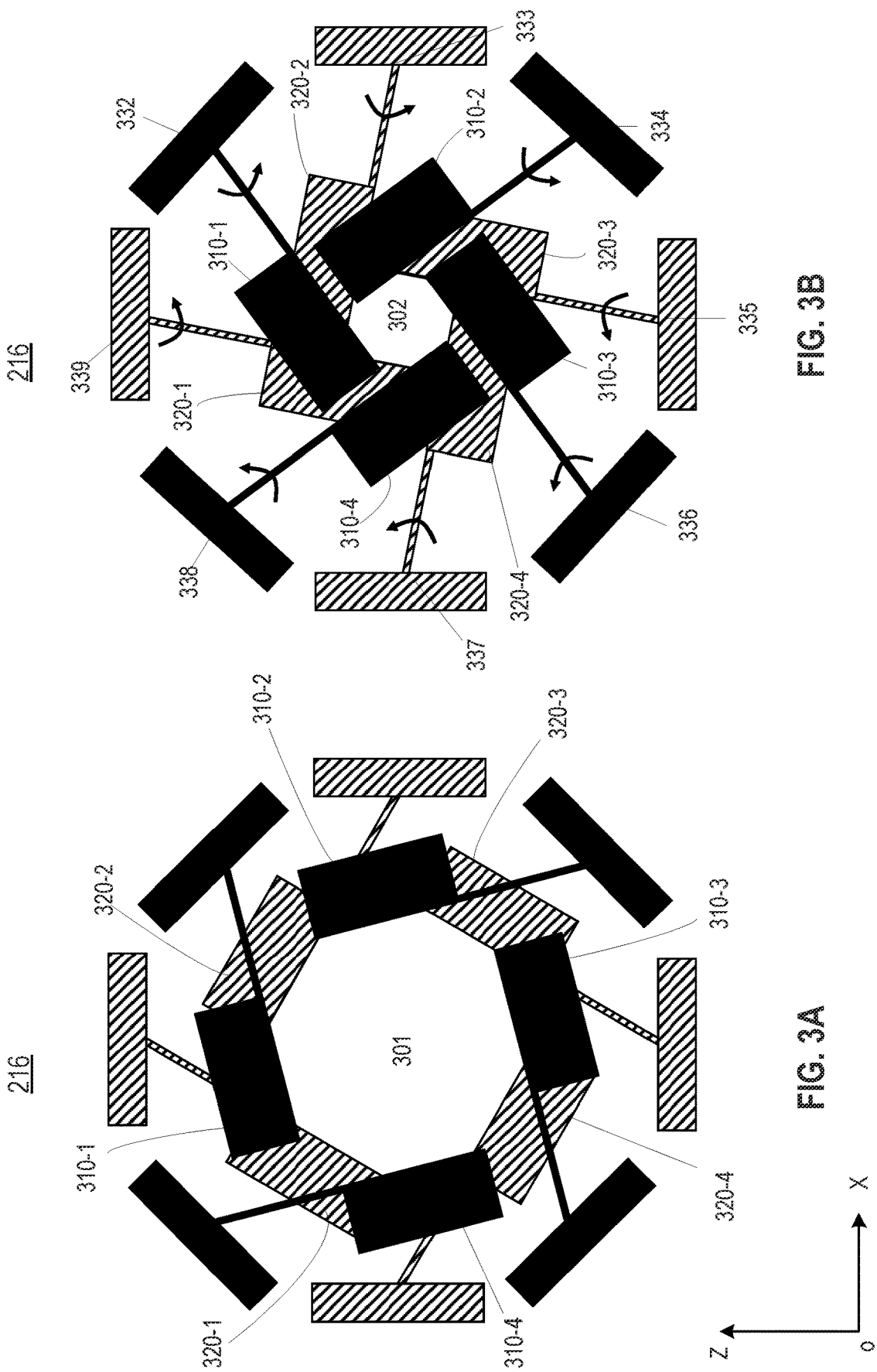
FIGS. 3A-3B each illustrates an exemplary top view of an adjustable iris in a receiver of a LiDAR system, according to embodiments of the disclosure.

For example, FIGS. 3A-3B each illustrates an exemplary top view of an adjustable iris 216 in a receiver of a LiDAR system, according to embodiments of the disclosure. In some embodiments, iris 216 includes at least two layers of rotary blades. Each blade may be driven by a MEMS actuator (not shown). In some embodiments, each layer may include at least two rotary blades. For example, as shown in FIG. 3A, iris 216 includes two layers of rotary blades (e.g., a top layer and a bottom layer). The top layer of iris 216 includes four blades 310-1, 310-2, 310-3, and 310-4 (each illustrated in a solid black rectangle). The bottom layer of iris 216 includes four blades 320-1, 320-2, 320-3, and 320-4 (each illustrated in a striped rectangle). It is contemplated that in various embodiments, iris 216 may include more than two layers of rotary blades and/or any suitable number of rotary blades in each layer. It is further contemplated that each layer may have identical or different number of blades. The multiple layers of blades may be stacked to collectively form an adjustable receiving aperture (e.g., aperture 301 in FIG. 3A) through which light can pass through. In general, more layers and more blades in each layer may make the formed receiving aperture closer to a circular shape and enable finer control of the aperture size. On the other hand, because each blade is driven by a MEMS actuator, too many layers or blades in iris 216 may challenge positioning of the actuators in a limited space.

In some embodiments, a reflective layer may be coated over a top surface of each rotary blade. As a result, only the portion of the light beam that impinge on the receiving aperture exposed by the blades can pass through iris 216, while the remaining portion impinging on the surfaces of the blades will be reflected. In some embodiments, the reflective layer may include a material of sufficiently high reflectivity to light, such as metals. For example, the reflective layer includes one or more of gold, aluminum, and platinum. In some embodiments, the shape of each blade is in a substantially rectangular shape, as shown in FIGS. 3A-3B.

Although the blades illustrated in FIGS. 3A-3B are rectangular in shape, other shapes are contemplated. Any shape that can reduce a gap size between every two blades and smooth a curve of the perimeter of the aperture formed by the blades can be used, such as a square, round, eclipse, or any other suitable shape.

In some embodiments, the rotary blades in different layers are circularly stagged between the layers to cover different orientations. For example, as shown in FIG. 3A, blades 310-1, 310-2, 310-3, 310-4, 320-1, 320-2, 320-3, and 320-4 are arranged circularly around a center of iris 216 and form a substantially circular aperture (e.g., aperture 301) for the returned light beams (e.g., returned laser beam 211) to pass through. In some embodiments, if iris 216 includes N layers, and each layer includes M rotary blades, the adjacent layers may be stagged with a 360/M/N degree angular difference. For example, in the embodiments shown in FIG. 3A, blades 310-1 to 310-4 of the first layer are stagged 45 degrees different in orientation compared to blades 320-1 to 320-4 of the second layer.

Consistent with the present disclosure, when the vertical detection angle (e.g., look-down angle θ) is larger than a certain value (e.g., the threshold angle), each rotary blade may rotate around a pivot in-plane of the corresponding layer to reduce the receiving aperture. For example, as shown in FIG. 3B, each of blades 310-1, 310-2, 310-3, 310-4, 320-1, 320-2, 320-3, and 320-4 may rotate counter-clockwise around its corresponding pivot (e.g., pivots 332-339) to collectively form an aperture 302 that is smaller than aperture 301 shown in FIG. 3A. In some embodiments, the rotary blades may simultaneously rotate towards the center of iris 216 to reduce the adjustable receiving aperture (e.g., aperture 302). In some embodiments, when the look-down angle θ is smaller than the threshold angle, the adjustable blades may simultaneously rotate away from the center to enlarge the adjustable receiving aperture (e.g., aperture 301). In some embodiments, the rotation of the rotary blades in iris 216 is synchronized, for example, by applying a same control signal.

Figure 4:
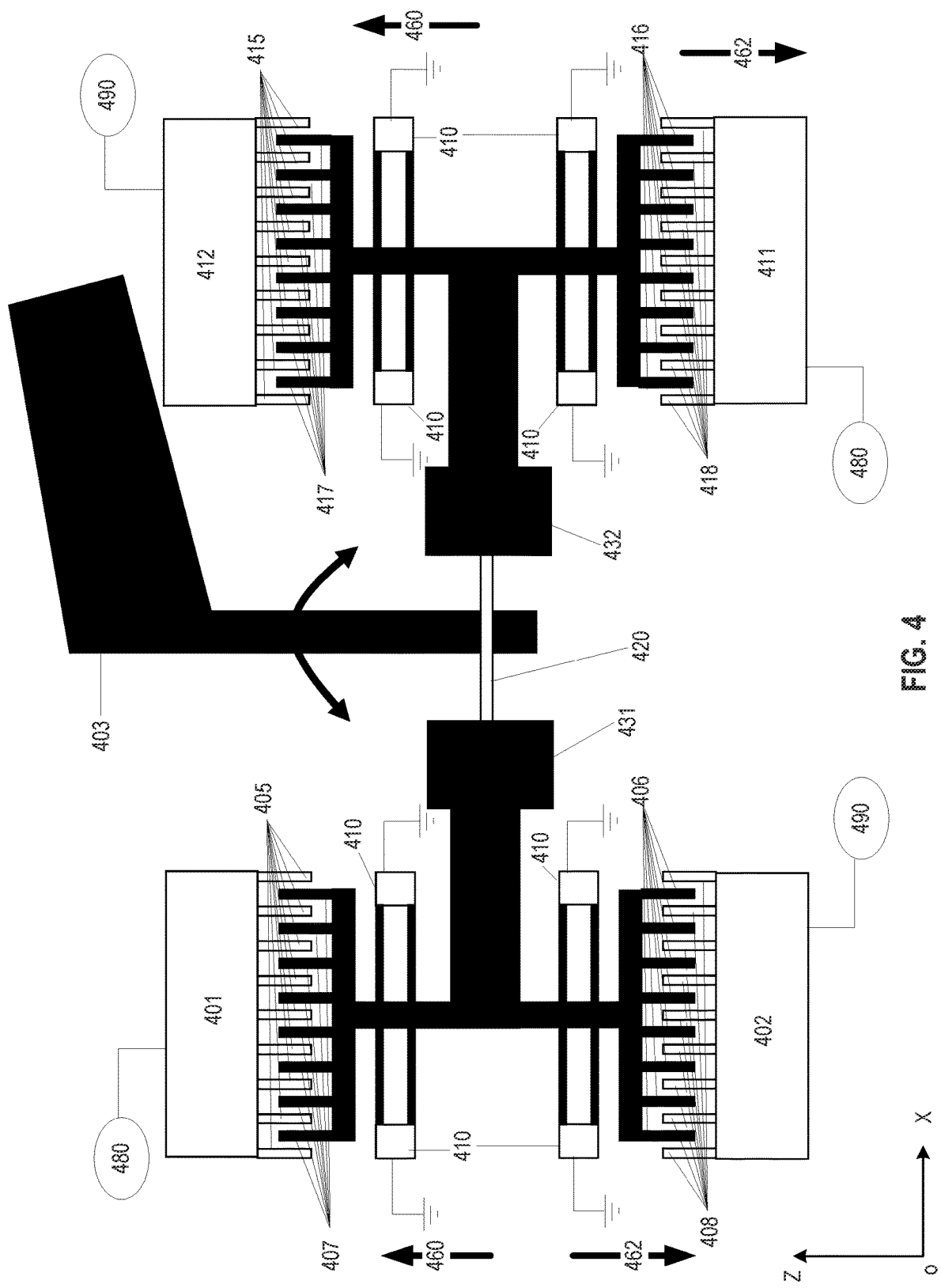
FIG. 4 illustrates a top view of an exemplary MEMS assembly for driving a rotary blade of an adjustable iris, according to embodiments of the disclosure.

In some embodiments, the movement (e.g., rotation) of each rotary blade may be driven by a MEMS assembly. For example, FIG. 4 illustrates a top view of an exemplary MEMS assembly 400 for driving a rotary blade of an adjustable iris, according to embodiments of the disclosure. In some embodiments, MEMS assembly 400 may include one or more actuators configured to drive a rotary blade 403 to rotate either clockwise or counterclockwise. For example, FIG. 4 shows MEMS assembly 400 that includes two movable structures 431 and 432 (illustrated in solid black). The electrostatic actuator further includes a rigid beam 420 connecting movable structures 431 and 432. In some embodiments, each of movable structures 431 and 432 may be connected to an electrostatic actuator formed by a pair of comb drives. For example, movable structure 431 is connected to a pair of two comb drives—one with comb fingers 405 and 407, and the other with comb fingers 406 and 408. Similarly, movable structure 432 is connected to another pair of two comb drives—one with comb fingers 415 and 417, and the other with comb fingers 416 and 418. Comb fingers connected to the movable structures (e.g., comb fingers 406, 407, 416 and 417) may be movable, while the comb fingers (e.g., comb fingers 405, 408, 415 and 418) coupled to them may be static. The static comb fingers may be mounted on anchors, e.g., comb fingers 405, 408, 415 and 418 mounted on anchors 401, 402, 411, and 412, respectively. The movable comb fingers along with the movable structure they are connected to are supported by anchors 410. The comb drives may be coupled to respective voltage sources in order to move the movable comb fingers. For example, the static comb fingers are coupled to voltage sources 480 and 490 through anchors 401, 402, 411, and 412, respectively. The movable static comb fingers are coupled to ground through anchors 410.

As shown in FIG. 4, the movable comb fingers couple with the respective static comb fingers. For example, comb fingers 405 couple and interleave with comb fingers 407, comb fingers 406 couple and interleave with comb fingers 408, comb fingers 415 couple and interleave with comb fingers 417, and comb fingers 416 couple and interleave with comb fingers 418.

In some embodiments, moveable structures 431 and 432 may move in opposite directions (e.g., upwards, and downwards) and rigid beam 420 is in-plane with the moving directions of movable structures 431 and 432. When voltage sources 480 and 490 apply a same voltage (e.g., 0V) on anchors 411 and 412, movable structures are in a static state as shown in FIG. 4. When voltage source 480 applies a positive voltage (e.g., 30V) on anchors 401 and 411 and voltage source 490 applies a zero voltage (e.g., 0V) on anchors 402 and 412, comb fingers 407 and 416 may move towards comb fingers 405 and 418 due to an attraction force, respectively. As a result, movable structures 431 and 432 move in opposite directions. For example, movable structure 431 may move upwards along a direction 460, and movable structure 432 may move downwards along a direction 462. Movable structures 431 and 432 may thereby deform rigid beam 420 and cause rotary blade 403 to rotate clockwise.

In some embodiments, movable structures 431 and 432 may be actuated to move in reverse directions to rotate rotary blade 403 counterclockwise. For example, when voltage source 490 applies a positive voltage (e.g., 30V) on anchors 402 and 412 and voltage source 480 applies a zero voltage (e.g., 0V) on anchors 401 and 411, comb fingers 406 and 417 may move towards comb fingers 408 and 415, respectively. As a result, movable structure 431 may move downwards along direction 462, and movable structure 432 may move upwards along direction 460. Movable structures 431 and 432 may therefore deform rigid beam 420 to cause rotary blade 403 to rotate counterclockwise. Although FIG. 4 only shows an exemplary MEMS assembly that drives one rotary blade, it is contemplated that each rotary blade shown in FIGS. 3A-3B may be driven by a similar MEMS assembly as shown in FIG. 4. The MEMS assemblies may actuate the rotary blades in different layers simultaneously to form an appropriate receiving aperture.

Returning to FIGS. 3A-3B, consistent with the present embodiments, the rotary blades may simultaneously rotate towards the center of iris 216 to reduce the adjustable receiving aperture (e.g., aperture 302). In some embodiments, MEMS actuators drive blades of a same layer may receive an identical driving signal simultaneously. The MEMS actuators thereby may drive the blades to have a same rotation angle. In some embodiments, MEMS actuators drive blades in different layers may receive different driving signals. The blades in different layers may have different rotation angles.

Figure 5:
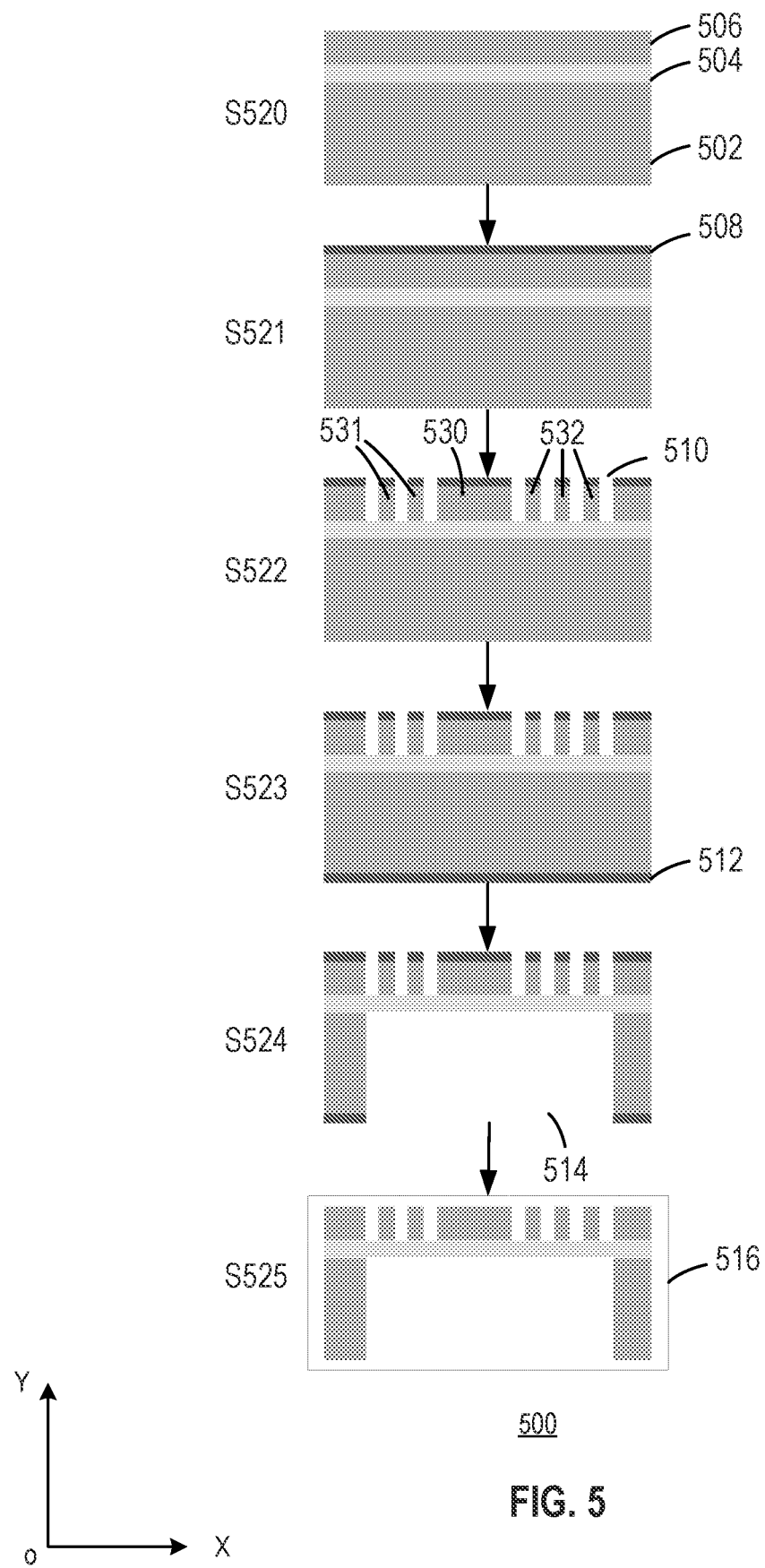
FIG. 5 illustrates a fabrication process of a rotary blade and its associated movable combs in an exemplary MEMS assembly, according to embodiments of the disclosure.

FIG. 5 illustrates a fabrication process 500 of a rotary blade and its associated movable combs in an exemplary MEMS assembly, according to embodiments of the disclosure. For illustration purpose, a cross-sectional view of the MEMS assembly at different stages of the fabrication process is shown in FIG. 5. In some embodiments, fabrication process 500 may include steps S520-S525. In some embodiments, the rotary blade (e.g., rotary blade 403), movable combs of the comb drives (e.g., comb fingers 406, 407, 416, 417), movable structures (e.g., movable structures 431 and 432), a rigid beam (e.g., rigid beam 420) and anchors (e.g., anchors 410) used in MEMS assembly 400 may be fabricated integrally using fabrication process 500.

In step S520, a silicon on insulator (SOI) wafer can be prepared. The SOI wafer may include a single crystal silicon device layer 506 on a single crystal silicon handle wafer 502 with a SiO2 insulator layer 504. Consistent with some embodiments, single crystal silicon device layer 506 may have sufficient stiffness and evenness on the top surface and the back surface (e.g., along the y axis).

In step S521, a first patterned hard mask layer 508 may be formed over the top surface of the SOI wafer. In some embodiments, first patterned hard mask layer 508 may be patterned to expose a portion of single crystal silicon device layer 506 by a suitable patterning process, such as a photolithography process and an etching process (e.g., wet etch and/or dry etch). In some embodiments, first patterned hard mask layer 508 may be made of silicon oxide.

In step S522, a first etching process may be performed to remove the exposed portion of single crystal silicon device layer 506 to form openings 510 that expose portions of SiO2 insulator layer 504. As a result, movable combs (e.g., comb fingers 531 and 532), a blade 530, movable structures (not shown) and a rigid beam (not shown) are formed in single crystal silicon device layer 506 in step S522 of FIG. 5.

In step S523, a second patterned hard mask layer 512 may be deposited over a bottom surface of the SOI wafer. In some embodiments, the first and second patterned hard mask layers 508 and 512 each includes silicon nitride and can be formed by any suitable deposition methods such as chemical vapor deposition (CVD), physical vapor deposition (PVD), atomic layer deposition (ALD), or a combination thereof.

In step S524, second patterned hard mask layer 512 may be patterned to expose a portion of single crystal silicon handle wafer 502. Further, a second etching process may be performed to remove the exposed portion of single crystal silicon handle wafer 502 using second patterned hard mask layer 512 as the etch mask until the bottom surface of SiO2 insulator layer 504 is exposed. In some embodiments, an anisotropic etch (e.g., a wet etch using KOH as the etching agent) is performed to remove the exposed portion of single crystal silicon handle wafer 502 and form a backside cavity 514. In step S525, the first and second patterned hard mask layers 508 and 512 may be removed, e.g., by a suitable etching process (e.g., dry and/or wet etch), to form structure 516.

Returning to FIG. 2, detector 218 may be configured to detect the portion of returned laser beam 211 that passed through the receiving aperture of iris 216. In some embodiments, detector 218 may convert the detected laser light (e.g., the portion of returned laser beam 211 passing through iris 216) into an electrical signal 219 (e.g., a current or a voltage signal). Electrical signal 219 may be generated when photons are absorbed in a photodiode included in detector 218. In some embodiments of the present disclosure, detector 218 may include a PIN detector, a PIN detector array, an avalanche photodiode (APD) detector, a APD detector array, a single photon avalanche diode (SPAD) detector, a SPAD detector array, a silicon photo multiplier (SiPM/MPCC) detector, a SiPM/MPCC detector array, or the like. In some embodiments, iris 216 and detector 218 may be integrated in a compact package.

Electrical signal 219 may be transmitted to a data processing unit, e.g., signal processor 220 of LiDAR system 102, to be processed and analyzed. For example, signal processor 220 may determine the distance of object 212 from LiDAR system 102 based on electrical signal 219 and data of laser beam 209. In some embodiments, signal processor may be a field-programmable gate array (FPGA), a microcontroller unit (MCU), a central processing unit (CPU), a digital signal processor (DSP), etc. In some embodiments, signal processor 220 may be part of controller 206.

Controller 206 may be configured to control transmitter 202 and/or receiver 204 to perform detection/sensing operations. In some embodiments consistent with the present disclosure, controller 206 may dynamically determine control signals for adjusting the receiving aperture of iris 216 to a target size based on the vertical detection angle of LiDAR system 102. The control signals may be applied to MEMS assembly 400 to drive each rotary blade of iris 216. For example, controller 206 may use a predetermined look-up table (LUT) to determine the control signals corresponding to the various vertical detection angles or the various detection distances. In some embodiments, controller 206 may control iris 216 to reduce the adjustable receiving aperture when the vertical detection angle surpasses a threshold angle. For example, controller 206 may determine the threshold angle based on an elevation of LiDAR system 102 positioned above the ground and a threshold detection distance of LiDAR system 102.

In some embodiments, controller 206 may generate and send control signals to iris 216 to adjust the receiving aperture size. For example, controller 206 may send the signal signals to MEMS assemblies 400 to adjust its bias voltage (e.g., voltages applied to anchors 401, 402, 411 and 412), thus rotating each rotary blade of the adjustable iris and varying the adjustable receiving aperture.

Figure 6:
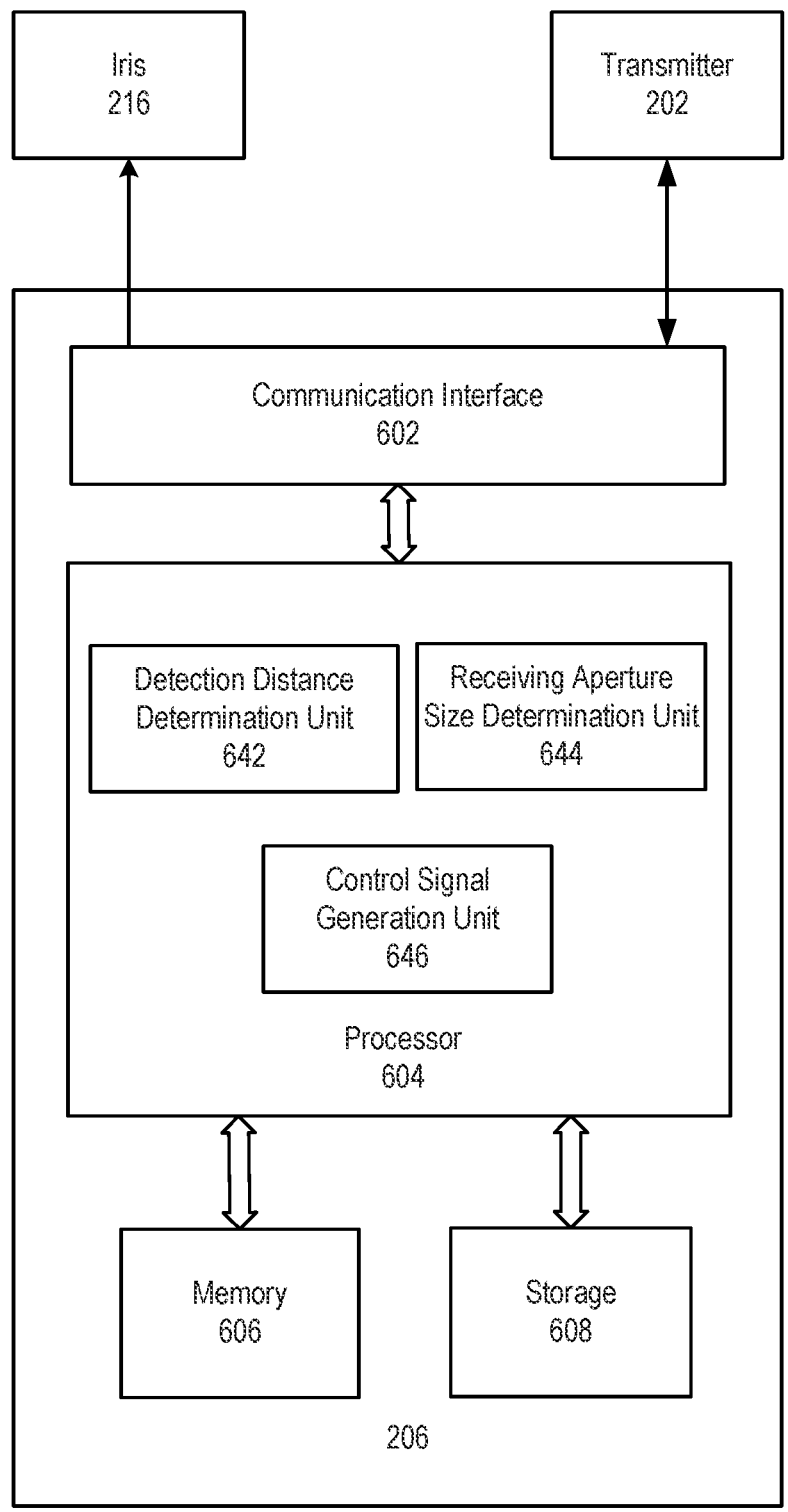
FIG. 6 illustrates a schematic diagram of an exemplary controller for adjusting a receiving aperture of a LiDAR system, according to embodiments of the disclosure.

For example, FIG. 6 illustrates a schematic diagram of an exemplary controller 206 for adjusting a receiving aperture of a LiDAR system, according to embodiments of the disclosure. As shown by FIG. 6, controller 206 may include a communication interface 602, a processor 604, a memory 606, and a storage 608. In some embodiments, controller 206 may have different modules in a single device, such as an integrated circuit (IC) chip (e.g., implemented as an application-specific integrated circuit (ASIC) or a field-programmable gate array (FPGA)), or separate devices with dedicated functions. In some embodiments, one or more components of controller 206 may be located in a cloud or may be alternatively in a single location (such as inside a mobile device) or distributed locations. Components of controller 206 may be in an integrated device or distributed at different locations but communicate with each other through a network (not shown). Consistent with the present disclosure, controller 206 may be configured to dynamically control the receiving aperture size of iris 216 based on the different vertical detection angles of the emitted laser beams. In some embodiments, controller 206 may also perform various other control functions of other components of LiDAR system 102.

Communication interface 602 may send signals to and receive signals from components of transmitter 202 and receiver 204 (such as iris 216 and components therein) via wired communication methods, such as Serializer/Deserializer (SerDes), Low-voltage differential signaling (LVDS), Serial Peripheral Interface (SPI), etc. In some embodiments, communication interface 602 may optionally use wireless communication methods, such as a Wireless Local Area Network (WLAN), a Wide Area Network (WAN), wireless networks such as radio waves, a cellular network, and/or a local or short-range wireless network (e.g., Bluetooth™), etc. Communication interface 602 can send and receive electrical, electromagnetic or optical signals in analog form or in digital form.

Consistent with some embodiments, communication interface 602 may receive scanning parameters, such as vertical detection angles of emitted laser beams, from transmitter 202. Communication interface 602 may provide command signals to iris 216 to drive MEMS actuators to dynamically adjust the receiving aperture of iris 216. Communication interface 602 may also receive acquired signals from and provide control signals to various other components of LiDAR system 102.

Processor 604 may include any appropriate type of general-purpose or special-purpose microprocessor, digital signal processor, or microcontroller. Processor 604 may be configured as a separate processor module dedicated to controlling the adjustable receiving aperture, e.g., dynamically determining a target receiving aperture size for iris 216 for receiving light beams of different vertical detection angles and generating command signals to adjust the receiving aperture of iris 216 to that target size. Alternatively, processor 604 may be configured as a shared processor module for performing other functions of LiDAR controls.

Memory 606 and storage 608 may include any appropriate type of mass storage provided to store any type of information that processor 604 may need to operate. Memory 606 and storage 608 may be a volatile or non-volatile, magnetic, semiconductor, tape, optical, removable, non-removable, or other type of storage device or tangible (i.e., non-transitory) computer-readable medium including, but not limited to, a ROM, a flash memory, a dynamic RAM, and a static RAM. Memory 606 and/or storage 608 may be configured to store one or more computer programs that may be executed by processor 604 to perform functions disclosed herein. For example, memory 606 and/or storage 608 may be configured to store program(s) that may be executed by processor 604 for controlling the adjustable receiving aperture in a LiDAR. In some embodiments, memory 606 and/or storage 608 may further store a predetermined LUT that maps various vertical detection angles or various detection distances to corresponding pre-calculated receiving aperture sizes. In some embodiments, memory 606 and/or storage 608 may also store intermediate data such as scanning angles of scanner 210, a threshold vertical detection angle, receiving aperture sizes for the respective vertical detection angles, etc.

As shown in FIG. 6, processor 604 may include multiple modules, such as a detection distance determination unit 642, a receiving aperture size determination unit 644, and a control signal generation unit 646, and the like. These modules can be hardware units (e.g., portions of an integrated circuit) of processor 604 designed for use with other components or software units implemented by processor 604 through executing at least part of a program. The program may be stored on a computer-readable medium, and when executed by processor 604, it may perform one or more functions. Although FIG. 6 shows units 642-646 all within one processor 604, it is contemplated that these units may be distributed among different processors located closely or remotely with each other.

Figure 7:
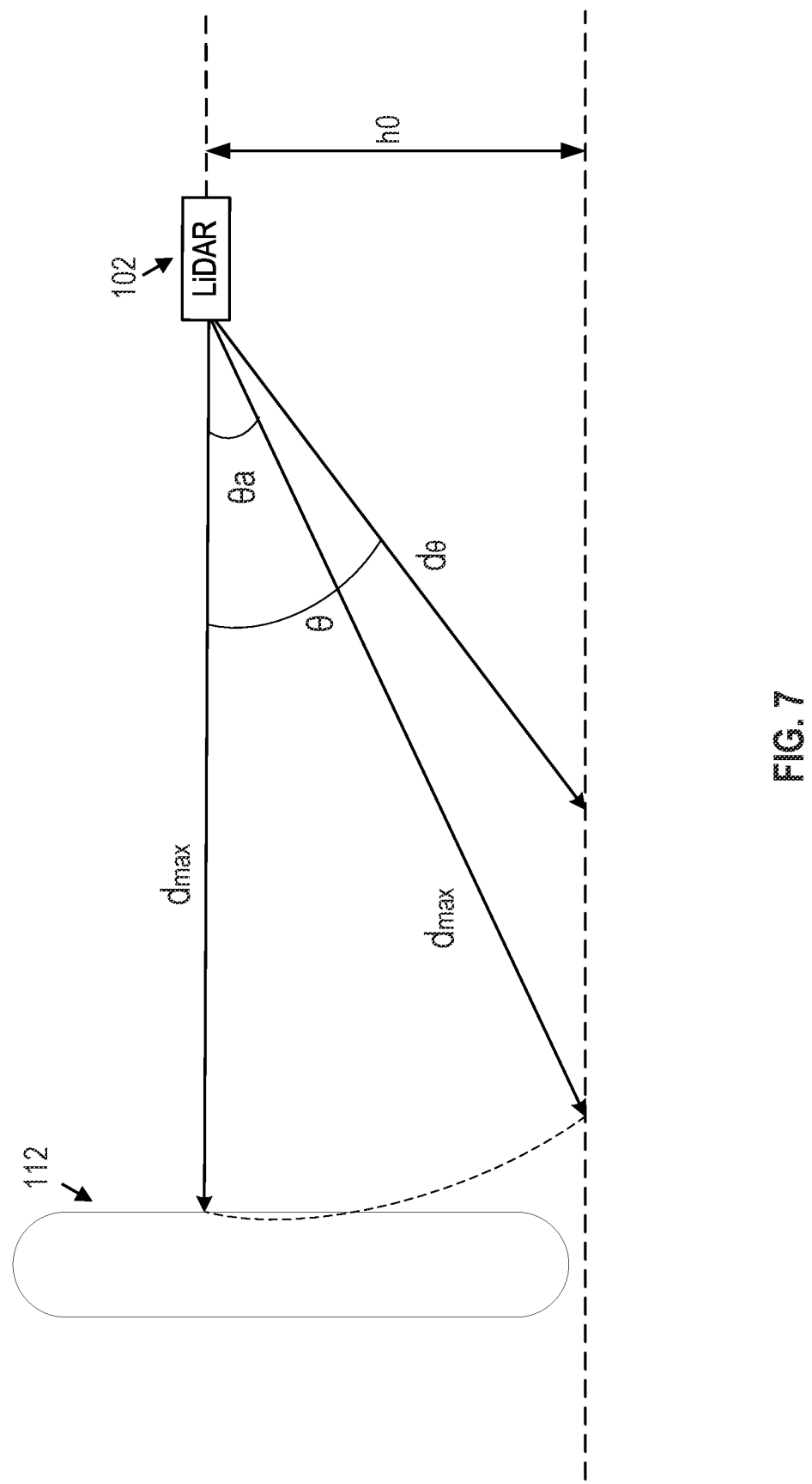
FIG. 7 illustrates vertical detection angles used during a LiDAR scan and corresponding detection distances, according to embodiments of the disclosure.

In some embodiments, detection distance determination unit 642 may calculate the detection distances corresponding to various vertical detection angles within the transmitter FOV. For example, FIG. 7 illustrates vertical detection angles used during a LiDAR scan and corresponding detection distances, according to embodiments of the disclosure. As shown in FIG. 7, LiDAR system 102 may locate at an elevation of $h_0$ above the ground plane. For example, LiDAR system 102 may be mounted on vehicle 100 and therefore lifted above the ground. LiDAR system 102 may have maximum detection distance $d_{max}$ (also referred to as a threshold detection distance), which corresponds to the horizontal distance between object 112 and LiDAR system 102.

In some embodiments, the detection distance may be calculated as a function of the vertical detection angle (e.g., look-down angle θ as shown in FIG. 7). For example, the vertical detection angles may be determined based on the vertical scanning angles of scanner 210, the tilt angle of LiDAR system 102 (e.g., by mounting structure 108), and the elevation angle if the vehicle on which LiDAR system 102 is mount is traveling on a slope (e.g., uphill or downhill). In some embodiments, the vertical scanning angles of scanner 210 may be stored in controller 206 or obtained from another controller that controls the scanning of laser beams. The tilt angle and/or the elevation angle, if non-zero, are subtracted from the vertical scanning angles to obtain the vertical detection angles. For example, if the vertical scanning angle is 40°, LiDAR system 102 is mounted to be tilted upward for 10°, and vehicle 100 is traveling downhill on a slope of 15° (i.e., a—15° elevation angle), the vertical detection angle is determined as 40°−10°−(−15°)=45°.

In some embodiments, the detection distances may be calculated differently for vertical detection angles in two ranges: a first range of [0, $θ_a$], where $θ_a$ is a threshold angle, and a second range of [$θ_a$, 90°]. In some embodiments, the threshold angle $θ_a$ may be determined according to Equation (1):

$$\theta_a = \sin^{-1}\left(\frac{h0}{d_{max}}\right), \quad (1)$$

where $h_0$ is the elevation of LiDAR system 102 above the ground plane, and $d_{max}$ is the maximum detection distance.

When the vertical detection angle (e.g., look-down angle θ as shown in FIG. 7) is smaller than $θ_a$ (i.e., in the first range), the detection distance remains $d_{max}$. When the look-down angle θ is larger than $θ_a$ (i.e., in the second range), the detection distance $d_θ$ becomes smaller. In some embodiments, the detection distance can be determined using Equation (2):

$$d_\theta = \frac{h0}{\sin\theta}. \quad (2)$$

Based on the determined detection distances, receiving aperture size determination unit 644 may calculate the target receiving aperture size (e.g., area of the receiving aperture $S_θ$) for iris 216. In some embodiments, for detection distances $d_θ$ shorter than the maximum detection distance $d_{max}$ (i.e., for vertical detection angles θ larger than the threshold angle $θ_a$), receiving aperture size determination unit 644 may reduce the receiving aperture from a maximum aperture size $S_{max}$ to a smaller size. In some embodiments, the target receiving aperture size ($S_θ$) may be proportional to a square of the respective detection distances. For example, receiving aperture size determination unit 644 may calculate the target receiving aperture size ($S_θ$) at look-down angle θ according to Equation (3):

$$S_\theta = \left(\frac{d_\theta}{d_{max}}\right)^2 \cdot S_{max}, \quad (3)$$

where $S_{max}$ is the maximum aperture size of iris 216, $d_θ$ is the detection distance at look-down angle θ, and $d_{max}$ is the maximum detection distance.

In some embodiments, the target receiving aperture size $S_θ$ corresponding to various vertical detection angles θs of the light beams may be calculated offline, e.g., by a separate processor, according to Equations (1)-(3). The mapping between the target receiving aperture sizes and the vertical detection angles or detection distances may be recorded in a LUT and preprogramed in controller 206. For example, the LUT may be stored in memory 606 or storage 608 of controller 206. According to such embodiments, the calculations performed by detection distance determination unit 642 described above may be skipped. Receiving aperture size determination unit 644 may determine the target receiving aperture size $S_θ$ by looking up the vertical detection angles θ or the detection distance $d_θ$ in the LUT.

In some alternative embodiments, receiving aperture size determination unit 644 may determine the target aperture size based on real-time detection result. For example, the detection distance is determined based on the actually detected object(s) rather than calculated by detection distance determination unit 642 based on the vertical detection angle.

Control signal generation unit 646 may generate control signals to adjust the receiving aperture of iris 216 according to the determination by receiving aperture size determination unit 644. In some embodiments, the control signals may be generated based on the target receiving aperture size $S_\theta$ determined by receiving aperture size determination unit 644 in order to adjust the receiving aperture of iris 216 to the target size $S_\theta$. In some embodiments, the control signals may be indicative of actuation parameters for MEMS assembly 400 to actuate each blade of iris 216 to achieve the target iris size. For example, the control signals may include the voltage biases of voltage sources 480 and 490 applied to the comb drives of MEMS assembly 400. The method for adjusting the receiving aperture will be described in more details in connection with FIG. 8.

In some alternative embodiments, controller 206 may use a LUT that maps the control signals directly to the vertical detection angles or the detection distances. The mapping can be predetermined based on the design of iris 216 (e.g., the blade configuration and the blade actuator's configuration). As a result, controller 206 do not need to include detection distance determination unit 642 or receiving aperture size determination unit, and control signals can be directly determined based on LUT according to the vertical detection angles or detection distances.

Figure 8:
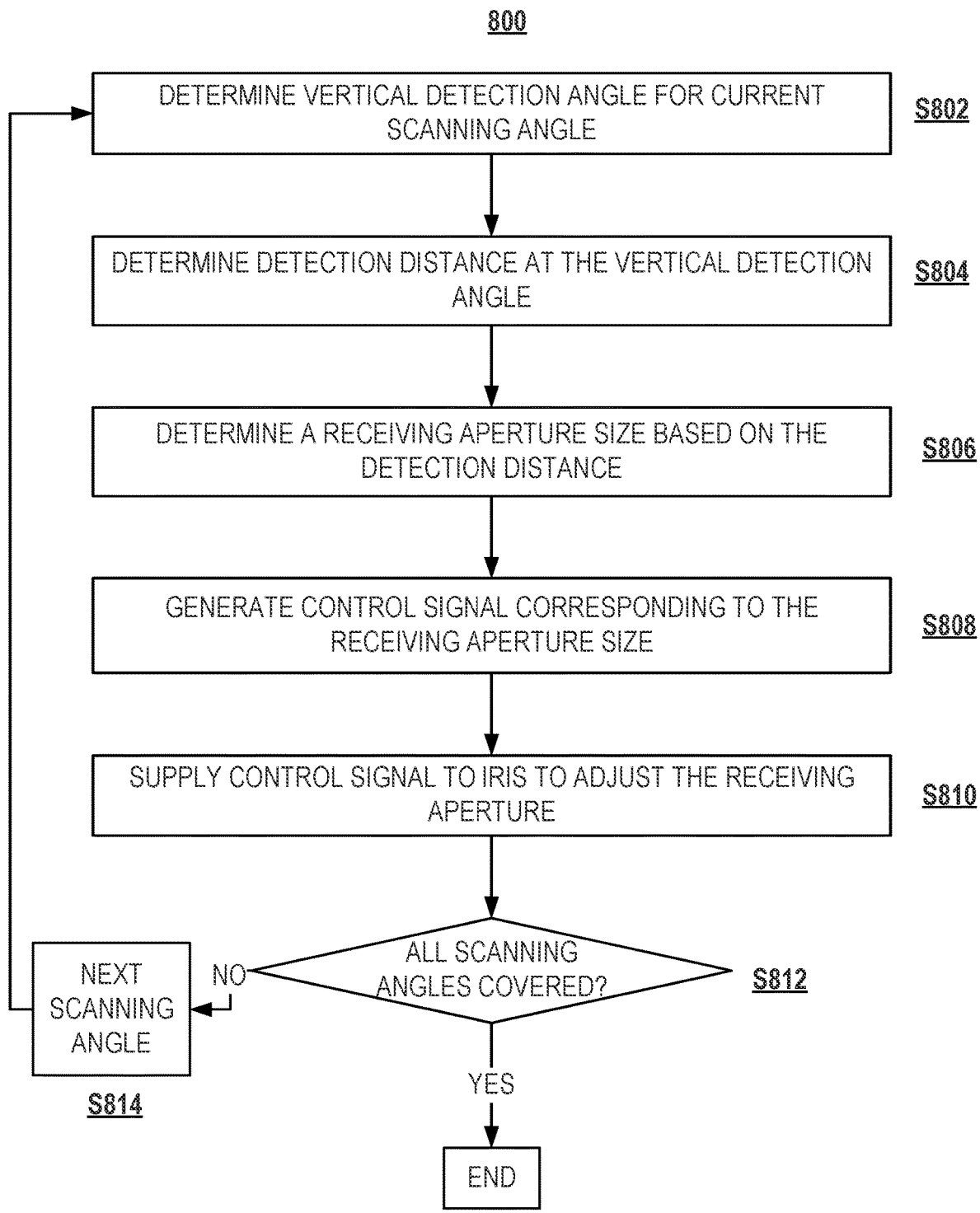
FIG. 8 is a flow chart of an exemplary method for adjusting a receiving aperture of a LiDAR system, according to embodiments of the disclosure.

FIG. 8 is a flow chart of an exemplary method 800 for adjusting a receiving aperture of a LiDAR system, according to embodiments of the disclosure. In some embodiments, method 800 may be performed by various components of LiDAR system 102, e.g., receiver 204 and controller 206. In some embodiments, method 800 may include steps S802-S814. It is to be appreciated that some of the steps may be optional. Further, some of the steps may be performed simultaneously, or in a different order than shown in FIG. 8.

In step S802, controller 206 may determine the vertical detection angle for the current scanning angle. In some embodiments, controller 206 may receive the current scanning angle used by transmitter 202. In some embodiments, controller 206 may be the same controller that determines the scanning parameters and therefore have the parameters saved in its memory/storage. Therefore, controller 206 may retrieve the scanning angle from its own memory/storage. Otherwise, controller 206 may receive it from an external source. In some embodiments, detection distance determination unit 842 may first determine the current vertical detection angle based on the scanning angle, as adjusted by the tilt angle of LiDAR system 102, and the elevation angle if the vehicle is traveling on a slope.

In step S804, controller 206 may then calculate the detection distance corresponding to the current vertical detection angle. For example, when the vertical detection angle $\theta$ is smaller than a threshold angle $\theta_a$ calculated, e.g., according to Equation (1), detection distance determination unit 642 may determine the detection distance remains the maximum detection distance $d_{max}$. When the angle $\theta$ surpasses than $\theta_a$, detection distance determination unit 642 may determine the detection distance using the elevation $h_0$ and a trigonometry of the angle $\theta$, e.g., according to Equation (2).

In step S806, controller 206 may determine a receiving aperture size for receiving the light beam emitted at the current scanning angle based on the detection distance determined in step S804. In some embodiments, for detection distances $d_\theta$ shorter than the maximum detection distance $d_{max}$, receiving aperture size determination unit 644 may reduce the receiving aperture of iris 216 from the maximum aperture size $S_{max}$ to a smaller one. In some embodiments, the target receiving aperture size $S_\theta$ may be proportional to a square of the respective detection distances. For example, receiving aperture size determination unit 644 may calculate the target receiving aperture size $S_\theta$ according to Equation (3).

In step S808, controller 206 may generate a control signal corresponding to the target receiving aperture size $S_\theta$ determined in step S806. In some embodiments, the control signal may be generated to adjust the bias voltages applied to MEMS assembly 400. In step S810, controller 206 may supply the control signal to the respective MEMS actuators of iris 216 to rotate the respective rotary blades to collectively achieve the target receiving aperture size.

In step S812, controller 206 may determine whether all scanning angles of scanner 210 have been covered, and if not (S812: NO), method 800 proceeds to step S814 to determine and adjust the receiving aperture for the next scanning angle, for example, by repeating steps S802-S810. Method 800 concludes after scanner 210 goes through all the scanning angles (S812: YES).

In some embodiments, steps S804 and S806 may be performed offline for all the vertical detection angles or detection distances to determine the corresponding target receiving aperture sizes. The results may be recorded in a LUT and saved with controller 206. In real-time execution, method 800 may skip steps S804 and S806, and instead, method 800 may include a step where controller 206 looks up the target receiving aperture size for the current vertical detection angle or detection distance from the predetermined LUT. By using a LUT, computation cost can be significantly reduced.

Although the disclosure is made using a LiDAR system as an example, the disclosed embodiments may be adapted and implemented to other types of optical sensing systems that use receivers to receive optical signals not limited to laser beams. For example, the embodiments may be readily adapted for optical imaging systems or radar detection systems that use electromagnetic waves to scan objects.

Another aspect of the disclosure is directed to a non-transitory computer-readable medium storing instructions which, when executed, cause one or more processors to perform the methods, as discussed above. The computer-readable medium may include volatile or non-volatile, magnetic, semiconductor-based, tape-based, optical, removable, non-removable, or other types of computer-readable medium or computer-readable storage devices. For example, the computer-readable medium may be the storage device or the memory module having the computer instructions stored thereon, as disclosed. In some embodiments, the computer-readable medium may be a disc or a flash drive having the computer instructions stored thereon.

It will be apparent to those skilled in the art that various modifications and variations can be made to the disclosed system and related methods. Other embodiments will be apparent to those skilled in the art from consideration of the specification and practice of the disclosed system and related methods.

It is intended that the specification and examples be considered as exemplary only, with a true scope being indicated by the following claims and their equivalents.

The invention claimed is:

1. An optical sensing system, comprising:
   a transmitter configured to emit light beams to an environment;
   a receiver configured to receive the light beams returning from the environment, the receiver comprising:
   an adjustable iris comprising a plurality of rotary blades each driven by a MEMS actuator, wherein the plurality of rotary blades collectively form an adjustable receiving aperture for the returned light beams to pass through, wherein the plurality of rotary blades are configured to rotate in order to vary the adjustable receiving aperture during operation of the optical sensing system; and a detector configured to detect the light beams that pass through the adjustable iris.

2. The optical sensing system of claim 1, wherein the transmitter is configured to emit the light beams to a plurality of detection distances, wherein the plurality of rotary blades are controlled to vary the adjustable receiving aperture based on the detection distances.

3. The optical sensing system of claim 1, wherein the plurality of rotary blades are controlled to reduce the adjustable receiving aperture when a vertical detection angle of the light beam surpasses a threshold angle, wherein the threshold angle is determined based on an elevation of the optical sensing system positioned above a ground and a threshold detection distance of the optical sensing system.

4. The optical sensing system of claim 2, wherein the plurality of rotary blades are controlled to vary the adjustable receiving aperture based on a predetermined look-up table mapping the respective vertical detection distances to receiving aperture sizes.

5. The optical sensing system of claim 1, wherein the plurality of rotary blades are arranged in at least two layers, each layer comprising at least two rotary blades arranged circularly around a center of the adjustable iris.

6. The optical sensing system of claim 5, wherein the rotary blades of different layers are circularly staggered between the layers to cover different orientations.

7. The optical sensing system of claim 5, wherein the rotary blades in the same layer are driven by the MEMS actuators to rotate towards the center of the adjustable iris to reduce the adjustable receiving aperture and rotate away from the center to enlarge the adjustable receiving aperture.

8. The optical sensing system of claim 1, wherein each rotary blade is substantially rectangular in shape.

9. The optical sensing system of claim 5, wherein each rotary blade rotates around a pivot in-plane in the respective layer.

10. The optical sensing system of claim 1, wherein the MEMS actuator driving each rotary blade comprises a pair of two comb drives each actuating a movable structure, wherein the rotary blade is mounted on a rigid beam connecting the two movable structures, wherein the two comb drives are configured to actuate the respective movable structures to cause the rotary blade to rotate.

11. The optical sensing system of claim 10, wherein the rigid beam is in-plane with moving directions of the two movable structures, wherein the two comb drives are configured to actuate the respective movable structures to move in opposite directions to cause the rotary blade to rotate.

12. The optical sensing system of claim 1, wherein the optical sensing system is a Light Detection and Ranging (LiDAR) system.

13. A method for sensing using an optical sensing system, comprising:

emitting, by a transmitter, light beams to an environment;

receiving, by an adjustable iris, the light beams returning from the environment, wherein the adjustable iris comprises a plurality of rotary blades each driven by a MEMS actuator, wherein the plurality of rotary blades collectively form an adjustable receiving aperture for the returned light beams to pass through, wherein receiving the light beams comprises controlling the plurality of rotary blades to rotate in order to vary the adjustable receiving aperture during operation of the optical sensing system; and detecting, by a detector, the light beams that pass through the adjustable iris.

14. The method of claim 13, wherein emitting the light beams to the environment comprises emitting the light beams to a plurality of detection distances, wherein controlling the plurality of rotary blades further comprises controlling the plurality of rotary blades to vary the adjustable receiving aperture based on the detection distances.

15. The method of claim 13, wherein controlling the plurality of rotary blades further comprises:

determining a threshold angle based on an elevation of the optical sensing system positioned above a ground and a threshold detection distance of the optical sensing system; and controlling the plurality of rotary blades to reduce the adjustable receiving aperture when a vertical detection angle of the light beam surpasses the threshold angle.

16. The method of claim 14, wherein controlling the plurality of rotary blades further comprises:

controlling the plurality of rotary blades to vary the adjustable receiving aperture based on a predetermined look-up table mapping the respective vertical detection distances to receiving aperture sizes.

17. The method of claim 13, wherein the plurality of rotary blades are arranged circularly around a center of the adjustable iris, wherein controlling the plurality of rotary blades further comprises controlling the plurality of rotary blades to rotate towards the center of the adjustable iris to reduce the adjustable receiving aperture and rotate away from the center to enlarge the adjustable receiving aperture.

18. The method of claim 13, wherein the MEMS actuator driving each rotary blade comprises a pair of two comb drives each actuating a movable structure, wherein the rotary blade is mounted on a rigid beam connecting the two movable structures, wherein controlling the plurality of rotary blades further comprises actuating the two movable structures to move in opposite directions to cause each rotary blade to rotate.

19. An adjustable iris, comprising:

a plurality of rotary blades collectively forming an adjustable receiving aperture for the returned light beams to pass through, wherein the plurality of rotary blades are arranged circularly around a center of the adjustable iris; and a plurality of MEMS actuators each driving a rotary blade, wherein the MEMS actuators are configured to rotate the respective rotary blades towards the center of the adjustable iris to reduce the adjustable receiving aperture and rotate away from the center to enlarge the adjustable receiving aperture.

20. The adjustable iris of claim 19, wherein the MEMS actuator driving each rotary blade comprises a pair of two comb drives each actuating a movable structure, wherein the rotary blade is mounted on a rigid beam connecting the two movable structures, wherein the two comb drives are configured to actuate the respective movable structures to move in opposite directions to cause the rotary blade to rotate.

* * * * *